United States Patent
Ueno

(10) Patent No.: US 7,516,667 B2
(45) Date of Patent: Apr. 14, 2009

(54) DIFFERENTIAL PRESSURE SENSOR HAVING SYMMETRICALLY-PROVIDED SENSOR CHIPS AND PRESSURE INTRODUCTION PASSAGES

(75) Inventor: Masato Ueno, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/819,552

(22) Filed: Jun. 28, 2007

(65) Prior Publication Data

US 2008/0000302 A1    Jan. 3, 2008

(30) Foreign Application Priority Data

Jun. 29, 2006   (JP) .............................. 2006-179563

(51) Int. Cl.
  *G01L 13/02*   (2006.01)
  *G01L 15/00*   (2006.01)
(52) U.S. Cl. .......................... 73/716; 73/717; 361/283.1
(58) Field of Classification Search ........... 73/700–756; 361/283.1–283.4
  See application file for complete search history.

(56) References Cited

U.S. PATENT DOCUMENTS

| | | | | |
|---|---|---|---|---|
| 4,131,088 A | * | 12/1978 | Reddy | 123/494 |
| 4,895,026 A | * | 1/1990 | Tada | 73/721 |
| 5,264,820 A | * | 11/1993 | Kovacich et al. | 338/42 |
| 5,471,884 A | * | 12/1995 | Czarnocki et al. | 73/720 |
| 5,889,212 A | * | 3/1999 | Guthrie et al. | 73/720 |
| 5,959,213 A | | 9/1999 | Ikeda et al. | |
| 6,564,642 B1 | * | 5/2003 | Clifford | 73/718 |
| 6,631,644 B2 | * | 10/2003 | Burczyk et al. | 73/716 |
| 7,152,480 B2 | | 12/2006 | Nomura | |
| 7,284,440 B2 | * | 10/2007 | Kurtz et al. | 73/753 |

FOREIGN PATENT DOCUMENTS

| | | |
|---|---|---|
| JP | H05-072073 | 3/1993 |
| JP | H05-248979 | 9/1993 |
| JP | H05-273067 | 10/1993 |
| JP | H07-225168 | 8/1995 |
| JP | 2006-023109 | 1/2006 |
| KR | 10 0186938 | 12/1998 |

OTHER PUBLICATIONS

Office Action dated Dec. 30, 2008 in corresponding Korean Patent Application No. 10-2007-0065715 (and English translation).

* cited by examiner

*Primary Examiner*—Andre J Allen
*Assistant Examiner*—Jermaine Jenkins
(74) *Attorney, Agent, or Firm*—Posz Law Group, PLC

(57) ABSTRACT

A differential pressure sensor includes a case, a first and a second pressure sensing element, a first and a second pressure introduction passage, and a differential pressure determining element. The first and second pressure sensing elements work to respectively sense a first and a second pressure. The first and second pressure introduction passages are provided to respectively introduce the first and second pressures to the first and second pressure sensing elements. The differential pressure determining element works to determine a differential pressure as the difference between the first and second pressures sensed by the first and second sensing elements. The first and second pressure sensing elements have the same shape and size and are symmetrically arranged in the case with respect to a reference. The first and second pressure introduction passages also have the same shape and size and are symmetrically positioned in the case with respect to the reference.

3 Claims, 7 Drawing Sheets

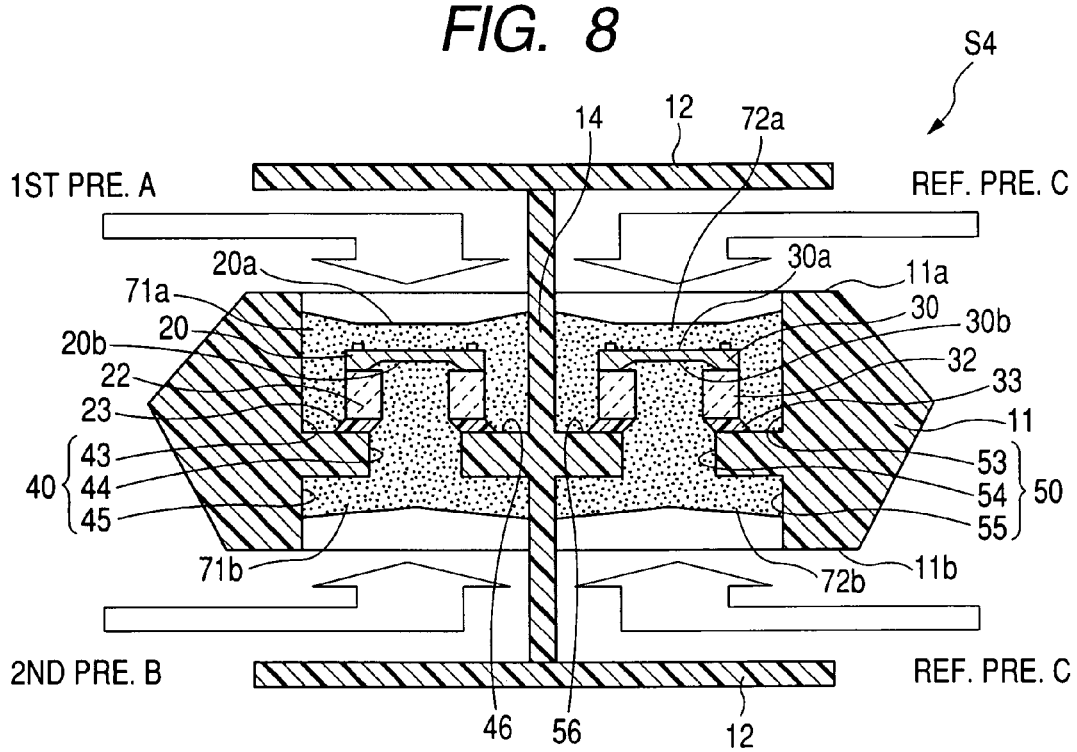
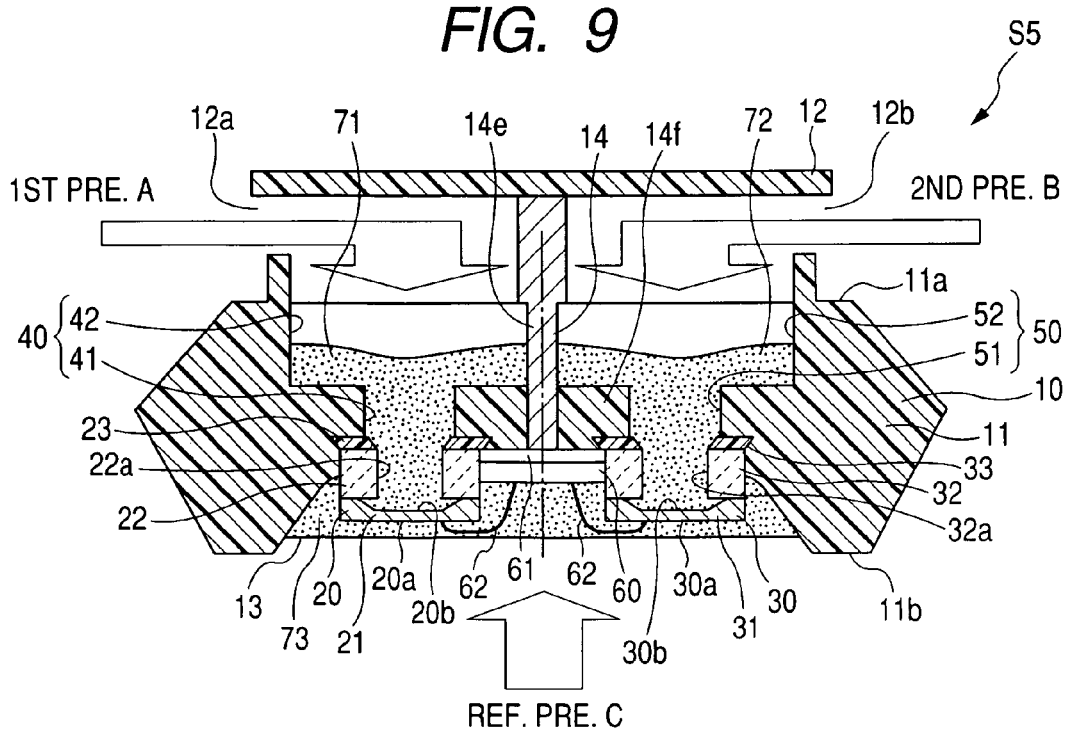

DIFFERENTIAL PRESSURE SENSOR HAVING SYMMETRICALLY-PROVIDED SENSOR CHIPS AND PRESSURE INTRODUCTION PASSAGES

CROSS-REFERENCE TO RELATED APPLICATION

This application is based on and claims priority from Japanese Patent Application No. 2006-179563, filed on Jun. 29, 2006, the content of which is hereby incorporated by reference into this application.

BACKGROUND OF THE INVENTION

1. Technical Field of the Invention

The present invention relates generally to pressure sensors. More particularly, the invention relates to a differential pressure sensor where sensor chips and pressure introduction passages are symmetrically provided to secure high accuracy of the differential pressure sensor regardless of environmental temperatures.

2. Description of the Related Art

Conventionally, there is known a type of differential pressure sensor which includes a pair of sensor chips and a circuit chip.

Each of the sensor chips works to output an electrical signal as a function of a pressure applied thereto. The circuit chip works to determine a differential pressure, which is the difference between the pressures applied to the sensor chips, based on the electrical signals output from the sensor chips. The circuit chip also works to output an electrical signal representative of the determined differential pressure. (For example, Japanese Patent First Publication No. H5-248979 discloses a pressure sensor of such type.)

Further, there is also known a structure of such type of differential pressure sensor, as shown in FIGS. 11-13.

More specifically, referring to FIG. 11, a differential pressure sensor S8 includes a case 81, a pair of sensor chips 82 and 83, an IC chip 84, capacitors 85, and a ceramic substrate 86. All the sensor chips 82 and 83, the IC chip 84, and the capacitors 85 are mounted on the substrate 86 and received along with the substrate 86 in the case 81. The case 81 has formed therein a pair of pressure introduction passages 87 and 88, through which the pressures are respectively introduced to the sensor chips 82 and 83 from external environments.

However, in the differential pressure sensor S8, referring to FIG. 12, the pressure introduction passages 87 and 88 are asymmetrically formed in the case 81. Further, referring to FIG. 13, the sensor chips 82 and 83, the IC chip 84, and the capacitors 85 are also asymmetrically arranged on the substrate 86.

Consequently, in practical use, it is difficult to secure high accuracy of the differential pressure sensor S8.

More specifically, in the differential pressure sensor S8, components made of different materials, such as the case 81 and the substrate 86, have different coefficients of linear expansion. Therefore, depending on the environmental temperatures, heat stresses may be induced in the differential pressure sensor S8. Further, due to the above-mentioned asymmetries, the heat stresses transmitted to the sensor chips 82 and 83 via the pressure introduction passages 87 and 88 are accordingly different from each other. Thus, in determination of the differential pressure by the IC chip 84, the heat stresses will not be completely cancelled by each other, resulting in a sensing error. Furthermore, due to the sensing error, a linear characteristic of the differential pressure sensor S8 can not be ensured.

SUMMARY OF THE INVENTION

The present invention has been made in view of the above-mentioned problems.

It is, therefore, a primary object of the present invention to provide a differential pressure sensor which has an improved structure that ensures high accuracy of the differential pressure sensor regardless of environmental temperatures.

According to the present invention, there is provided a differential pressure sensor which includes a case, a first and a second pressure sensing element, a first and a second pressure introduction passage, and a differential pressure determining element.

The first and second pressure sensing elements are received in the case. The first pressure sensing element works to sense a first pressure and output a first electrical signal representative of the sensed first pressure. The second pressure sensing element works to sense a second pressure and output a second electrical signal representative of the sensed second pressure.

The first and second pressure introduction passages are provided in the case to introduce the first and second pressures to the first and second pressure sensing elements, respectively.

The differential pressure determining element works to determine a differential pressure, which is the difference between the first and second pressures, based on the first and second electric signals output from the first and second pressure sensing elements. The differential pressure determining element also works to output an electrical signal representative of the determined differential pressure.

Further, in the above differential pressure sensor, the first and second pressure sensing elements have the same shape and size and are symmetrically arranged in the case with respect to a reference. The first and second pressure introduction passages also have the same shape and size and are symmetrically positioned in the case with respect to the reference.

With such a configuration, the relation in position between the first pressure sensing element and the first pressure introduction passage is the same as that between the second pressure sensing element and the second pressure introduction passage.

Consequently, during operation of the differential pressure sensor, heat stress induced in the case and transmitted to the first pressure sensing element via the first pressure introduction passage will be equal to that induced in the case and transmitted to the second pressure sensing element via the second pressure introduction passage. Thus, in determination of the differential pressure by the differential pressure determining element, the heat stresses will be canceled by each other, thereby bringing the determined differential pressure into agreement with the difference between the first and second pressures.

Accordingly, the differential pressure sensor according to the invention can accurately determine the differential pressure regardless of environmental temperatures.

Moreover, in the differential pressure sensor according to the invention, a separation wall may be provided in the case to separate the first and second pressure introduction passages; the reference, with respect to which the first and second pressure sensing elements are symmetrically arranged and the first and second pressure introduction passages are symmetrically positioned, may be made up of the separation wall.

Further, in this case, it is preferable that at least part of the separation wall be made of a material having higher heat conductivity than that of the case.

Otherwise, in the differential pressure sensor according to the invention, the reference may be made up of a hypothetical center line of the case so that when viewed along the center line, the first and second pressure sensing elements and the first and second pressure introduction passages are respectively in point symmetry with respect to the center line.

In the differential pressure sensor according to the invention, each of the first and second pressure introduction passages preferably have a circular cross-section portion; the circular cross-section portions of the first and second pressure introduction passages preferably have the same shape and size and are symmetrically positioned with respect to the reference; and the first and second pressure sensing elements are preferably coaxially arranged with the circular cross-section portions of the first and second pressure introduction passages, respectively.

In the differential pressure sensor according to the invention, the differential pressure determining element may be received in the case. In this situation, it is preferable that the differential pressure determining element be symmetrically arranged in the case with respect to the reference.

In the differential pressure sensor according to the invention, the case may be made of a resin and an additive. In this case, it is preferable that the additive be substantially symmetrically distributed in the case with respect to the reference.

The differential pressure sensor according to the invention may further include a first and a second pressure transmission medium that are filled in the first and second pressure introduction passages to transmit the first and second pressures to the first and second pressure sensing elements, respectively. In this case, it is preferable that the first and second pressure transmission mediums be formed to have the same shape and size and be symmetric with respect to the reference. Further, it is also preferable that the first and second pressure transmission mediums be made of the same gel-like material.

The differential pressure sensor according to the invention may further include a third and a fourth pressure introduction passages which are provided in the case to introduce a reference pressure respectively to the first and second pressure sensing elements; the case may have a first and a second end face that are opposite to each other; the first and second pressure introduction passages may be formed through the first end face of the case, and the third and fourth pressure introduction passages may be formed through the second end face of the case; the first pressure sensing element may be configured to sense the first pressure as a first relative pressure to the reference pressure, and the second pressure sensing element may be configured to sense the second pressure as a second relative pressure to the reference pressure; and the differential pressure determining element may be configured to determine the differential pressure as the difference between the first and second relative pressures.

Further, in this case, the differential pressure sensor may further include a third and a fourth pressure transmission medium which are filled in the third and fourth pressure introduction passages to transmit the reference pressure to the first and second pressure sensing elements and absorb heat from the first and second pressure introduction passages, respectively; the third pressure transmission medium may be preferably formed with a larger amount of a gel-like material than the fourth pressure transmission medium.

Otherwise, the differential pressure sensor may further include a pressure transmission medium which is filled only in the third one of the third and fourth pressure introduction passages to transmit the reference pressure to the first pressure sensing element and absorb heat from the first pressure introduction passage.

BRIEF DESCRIPTION OF THE DRAWINGS

The present invention will be understood more fully from the detailed description given hereinafter and from the accompanying drawings of the preferred embodiments of the invention, which, however, should not be taken to limit the invention to the specific embodiments but are for the purpose of explanation and understanding only.

In the accompanying drawings:

FIG. 8 is a cross-sectional side view of a differential pressure sensor according to the fourth embodiment of the invention;

FIG. 9 is a cross-sectional side view of a differential pressure sensor according to the fifth embodiment of the invention;

DESCRIPTION OF THE PREFERRED EMBODIMENTS

The preferred embodiments of the present invention will be described hereinafter with reference to FIGS. 1-10.

First Embodiment

Figure 1:
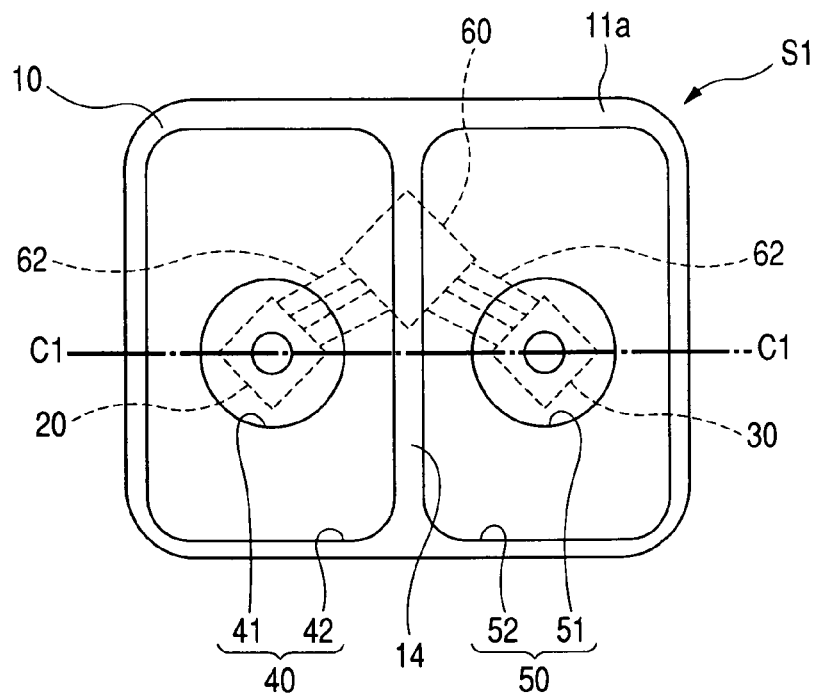
FIG. 1 is a schematic plan view of a differential pressure sensor according to the first embodiment of the invention, wherein a cover portion of a case of the differential pressure sensor is omitted.
Figure 2:
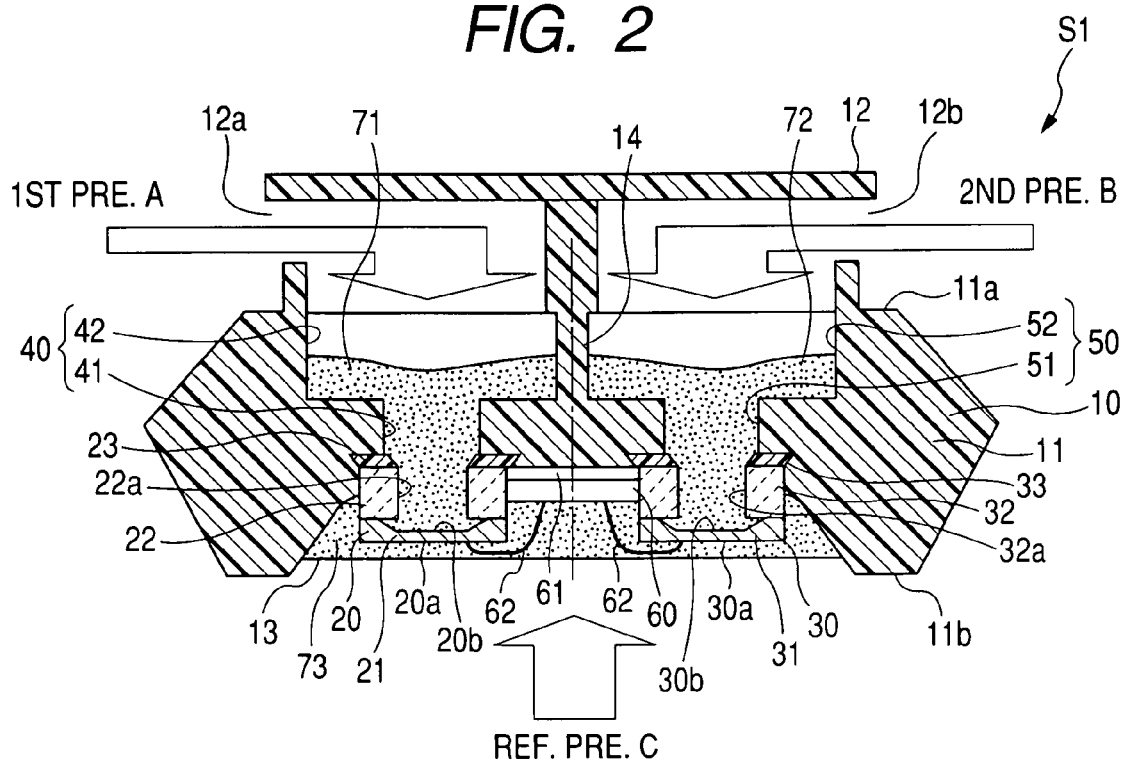
FIG. 2 is a cross-sectional side view of the differential pressure sensor.

FIGS. 1-2 show a differential pressure sensor S1 according to the first embodiment of the invention.

The differential pressure sensor S1 is designed to detect the pressure loss caused by a Diesel Particulate Filter (DPF) arranged in the exhaust pipe of a diesel engine for an automobile. More specifically, in the present embodiment, the differential pressure sensor S1 is designed to sense the difference in pressure between exhaust gases on the upstream and downstream sides of the DPF.

As shown in FIG. 2, the differential pressure sensor S1 includes a case 10, a first sensor chip 20, a second sensor chip 30, a first pressure introduction opening 40, a second pressure introduction opening 50, and a semiconductor circuit chip 60.

The case 10 is provided to accommodate therein the first and second sensor chips 20 and 30 and the circuit chip 60. The case 10 is made of a resin, such as PBT (polybutylene terephthalate) or PPS (polyphenylene sulfide), and an additive, such as glass filler. The overall shape of the case 10 is flat. The case 10 includes a body portion 11 and a cover portion 12.

The body portion 11 has, as shown in FIG. 2, an upper face 11a and a lower face 11b which are substantially parallel to each other. Further, in the body portion 11, there are formed the first and second pressure introduction openings 40 and 50 which open on the upper face 11a of the body portion 11 and are aligned on the longitudinal axis C1-C1 of the body portion 11, as shown in FIG. 1. On the other hand, on the lower face 11b of the body portion 11, there is formed a recess 13, in which the first and second sensor chips 20 and 30 and the circuit chip 60 are received. In addition, each of the first and second pressure introduction openings 40 and 50 communicates with the recess 13, thus penetrating the body portion 11 in the thickness-wise direction of the body portion 11.

The cover portion 12 covers the first and second pressure introduction openings 40 and 50, forming a first port 12a and a second port 12b between the body and cover portions 11 and 12. The first and second ports 12a and 12b respectively communicate with the first and second pressure introduction openings 40 and 50.

Each of the first and second sensor chips 20 and 30 is configured to output an electrical signal as a function of a pressure applied thereto. In the present embodiment, each of the first and second sensor chips 20 and 30 is configured with a semiconductor sensor chip which includes a semiconductor substrate made of, for example, silicone and a diaphragm formed in the substrate. More specifically, referring to FIGS. 1 and 2, the first sensor chip 20 has a rectangular flat face 20a facing the opening of the recess 13 and a rectangular recessed face 20b facing the first pressure introduction opening 40. The flat and recessed faces 20a and 20b together form a diaphragm 21 in the first sensor chip 20. Similarly, the second sensor chip 30 has a rectangular flat face 30a facing the opening of the recess 13 and a rectangular recessed face 30b facing the second pressure introduction opening 50. The flat and recessed faces 30a and 30b together form a diaphragm 31 in the second sensor chip 30.

It should be emphasized that in the present embodiment, the first and second sensor chips 20 and 30 are formed to have the same shape and size.

Figure 3:
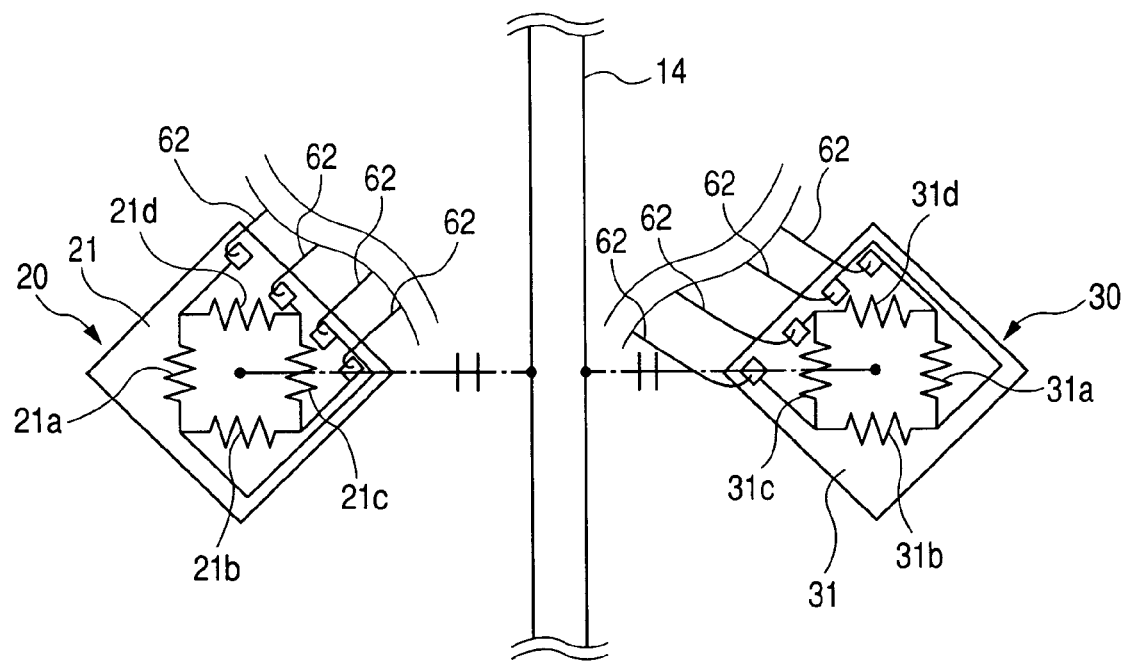
FIG. 3 is a schematic plan view showing a symmetric arrangement of sensor chips in the differential pressure sensor.

Referring further to FIG. 3, the diaphragm 21 has formed therein four piezoresistors 21a-21d, which together make up a bridge circuit. When a first pressure A and a reference pressure C are respectively applied on the flat and recessed faces 20a and 20b of the first sensor chip 20, the diaphragm 21 will be deflected, thereby generating the electrical signal representative of the difference between the pressures A and C through the bridge circuit formed therein. Similarly, the diaphragm 31 has formed therein four piezoresistors 31a-31d, which together make up a bridge circuit. When a second pressure B and a reference pressure C are respectively applied on the flat and recessed faces 30a and 30b of the second sensor chip 30, the diaphragm 31 will be deflected, thereby generating the electrical signal representative of the difference between the pressures B and C through the bridge circuit formed therein.

Further, as shown in FIG. 2, the first and second sensor chips 20 and 30 are disposed within the recess 13 of the body portion 11 of the case 10 and mounted to the bottom face of the recess 13 via seats 22 and 32, respectively. The seats 22 and 32 are made of, for example, glass, and have respectively formed therein through-holes 22a and 32a, which communicate with the first and second pressure introduction openings 40 and 50, respectively. Further, in the present embodiment, the seats 22 and 32 have the same shape and size.

In addition, the first and second sensor chips 20 and 30 are respectively joined to the seats 22 and 32 by, for example, anodic joining. On the other hand, the seats 22 and 32 are joined to the body portion 11 of the case 10 by means of silicone-based adhesives 23 and 33, respectively. Thus, the first and second sensor chips 20 and 30 are firmly secured in the case 10.

The first and second pressure introduction openings 40 and 50 are provided to introduce the pressures of exhaust gases on the upstream and downstream sides of the DPF to the first and second sensor chips 20 and 30, respectively. Hereinafter, the pressures of exhaust gases on the upstream and downstream sides of the DPF will be respectively referred to as the first pressure A and the second pressure B.

The first and second pressure introduction openings 40 and 50 are separated by a separation wall 14 that is formed in the body portion 11 of the case 10 with even wall thickness. The first and second pressure introduction openings 40 and 50 are formed to have the same shape and size. It should be noted that the meaning of shape here is intended to cover all kinds of shapes, including cross-sectional shapes and planar shapes.

The first pressure introduction opening 40 includes a circular cross-section portion 41 on the recess 13-side and a rectangular cross-section portion 42 on the upper face 11a-side. The diameter of the circular portion 41 is less than both the length and width of the rectangular portion 42. Similarly, the second pressure introduction opening 50 includes a circular cross-section portion 51 on the recess 13-side and a rectangular cross-section portion 52 on the upper face 11a-side. The diameter of the circular portion 51 is less than both the length and width of the rectangular portion 52.

Further, the first and second pressure introduction openings 40 and 50 are filled with first and second pressure transmission mediums 71 and 72, respectively. The first pressure transmission medium 71 also fills the through-hole 22a of the seat 22 so as to occupy the recessed face 20b of the first sensor chip 20. Similarly, the second pressure transmission medium 72 also fills the through-hole 32a of the seat 32 so as to occupy the recessed face 30b of the second sensor chip 30. In addition, in the present embodiment, the first and second pressure transmission mediums 71 and 72 are formed with the same amount of a gel-like material, so that they have the same shape and size.

The first and second pressure transmission mediums 71 and 72 serve to transmit the first and second pressures A and B from the first and second ports 12a and 12b to the recessed faces 20a and 30a of the first and second sensor chips 20 and 30, respectively; they also serve to protect the first and second sensor chips 20 and 30 and the first and second pressure introduction openings 40 and 50 from moisture and the exhaust gases which are generally corrosive.

The semiconductor circuit chip 60 is configured to input the electrical signals output from the first and second sensor chips 20 and 30, determine a differential pressure, which is the difference between the pressure differences sensed by the sensor chips 20 and 30, based on the input electrical signals, and output an electrical signal representative of the determined differential pressure.

The circuit chip 60 is arranged within the recess 13 of the body portion 11 of the case 10 between the first and second sensor chips 20 and 30 and fixed to the bottom face of the recess 13 by an adhesive 61. Further, as shown in FIGS. 1-3, the circuit chip 60 is electrically connected to both the first and second sensor chips 20 and 30 via boding wires 62 which are made of gold, aluminum, or the like.

In addition, though not graphically shown, there is further provided in the body portion 11 of the case 10 a connector for making electrical connection between the circuit chip 60 and external devices or circuits. More specifically, the connector includes terminals electrically connected to the circuit chip 60, via which the sensor chip 60 can input and output signals from and to, for example, an engine ECU of the automobile.

The recess 13 of the body portion 11 of the case 10 is, on the other hand, filled with a third pressure transmission medium 73 which is also made of a gel-like material. The third pressure transmission medium 73 completely seals all the members disposed in the recess 13, including the first and second sensor chips 20 and 30, the circuit chip 60, and boding wires 62, thereby protecting them from foreign matters. Further, the third pressure transmission medium 73 is exposed to the atmosphere, so that it can transmit the atmospheric pressure to the flat faces 20a and 30a of the first and second sensor chips 20 and 30, respectively. Hereinafter, the atmospheric pressure will be referred to as reference pressure C.

In addition, the pressure transmission mediums 71, 72, and 73 may be made of, for example, fluoric gel, silicone gel, or fluorosilicone gel. In particular, when the differential pressure sensor S1 is employed to sense the pressure difference of exhaust gases as in the present embodiment, it is preferable to use fluoric gel which has excellent acid resisting properties.

In the present embodiment, the first and second sensor chips 20 and 30 and the first and second pressure introduction openings 40 and 50 have a symmetrical planar layout. The planar layout here denotes the layout of those in the differential pressure sensor S1 when viewed along the thickness-wise direction of the body portion 11 of the case 10.

More specifically, referring again to FIG. 1, the first and second pressure introduction openings 40 and 50 have the same shape and size, as described previously, and are symmetrically positioned with respect to the separation wall 14 of the case 10. In other words, in the present embodiment, the separation wall 14 of the case 10 makes up a reference for symmetry of the first and second pressure introduction openings 40 and 50. Further, the first and second sensor chips 20 and 30 have the same shape and size, as described previously, and are coaxially arranged with the circular cross-section portions 41 and 51 of the first and second pressure introduction openings 40 and 50, respectively. Accordingly, the first and second sensor chips 20 and 30 are also symmetrically positioned with respect to the separation wall 14 of the case 10.

In addition, in the present embodiment, the semiconductor circuit chip 60 has the shape of a rectangular plate and is arranged in the case 10 with a diagonal thereof on the separation wall 14. Accordingly, the circuit chip 60 is also symmetrically positioned with respect to the separation wall 14. Moreover, the seats 22 and 32, on which the first and second sensor chips 20 and 30 respectively seat, are also symmetrically arranged with respect to the separation wall 14.

Figure 4:
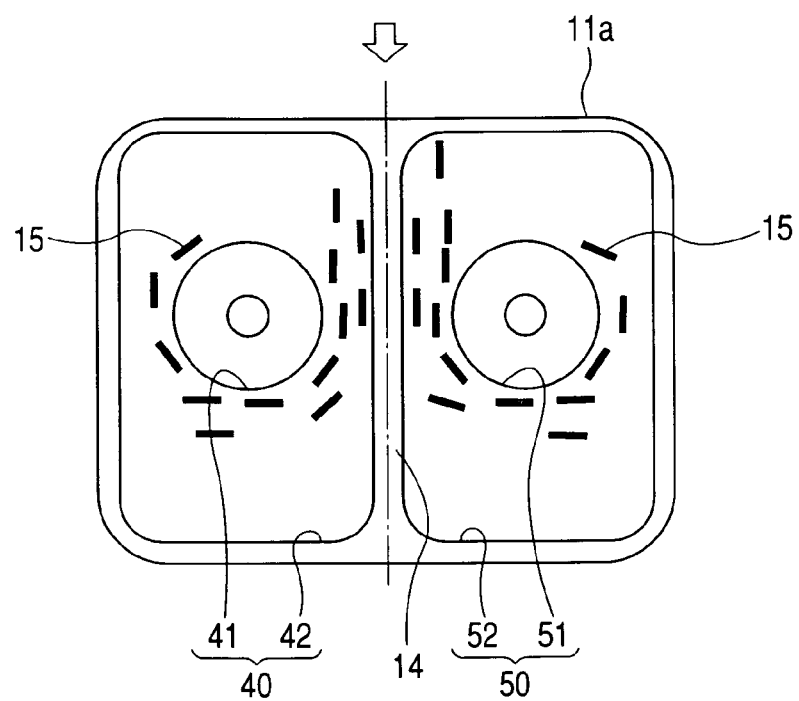
FIG. 4 is a schematic plan view illustrating a symmetric distribution of an additive in the case of the differential pressure sensing element.

Referring further to FIG. 4, in the present embodiment, the additive 15 included in the case 10 has a fibrous shape and is symmetrically distributed in the case 10 with respect to the separation wall 14. In addition, such a symmetrical distribution of the additive 15 can be obtained, in manufacturing the case 10 by resin injection molding, by positioning the gate for injection molding in alignment with the separation wall 14 and orienting the gate as indicated with an arrow in FIG. 4. This is because with this positing and orientation of the gate, the resin will symmetrically flow with respect to the separation wall 14, and thus the additive 15 will be symmetrically distributed following the resin flow.

After having described the overall configuration of the differential pressure sensor S1, operation thereof will be described hereinafter.

First, as shown in FIG. 2, the first pressure A is introduced to the first pressure introduction opening 40 via the first port 12a; the second pressure B is introduced to the second pressure introduction opening 50 via the second port 12b.

Consequently, the first sensor chip 20 receives, on the recessed face 20b thereof, the first pressure A via the first pressure transmission medium 71; it also receives, on the flat face 20a thereof, the reference pressure C via the third pressure transmission medium 73.

Thus, in a theoretical sense, the first sensor chip 20 senses the difference between the first pressure A and the reference pressure C, and the electrical signal output therefrom to the circuit chip 60 represents the difference (A–C). However, in practical use, the temperatures of the exhaust gases are usually very high, and thus heat stresses will be induced in the differential pressure sensor S1 due to the differences in coefficient of linear expansion between the components of the sensor S1. Consequently, the first sensor chip 20 also receives, on the recessed face 20b thereof, a heat stress H1, which is transmitted thereto via the seat 22 of the case 10, and a heat stress G1 that is transmitted thereto via the first pressure transmission medium 71. Thus, the sensor chip 20 actually senses a pressure difference X, which is equal to (A+H1+G1–C), and the electrical signal output therefrom to the circuit chip 60 accordingly represents the pressure difference X.

Similarly, the second sensor chip 30 receives, on the recessed face 30b thereof, the second pressure B via the second pressure transmission medium 72; it also receives, on the flat face 30a thereof, the reference pressure C via the third pressure transmission medium 73. Further, in practical use, the second sensor chip 30 also receives, on the recessed face 30b thereof, a heat stress H2, which is transmitted thereto via the seat 32 of the case 10, and a heat stress G2 that is transmitted thereto via the second pressure transmission medium 72. Thus, the second sensor chip 30 actually senses a pressure difference Y, which is equal to (B+H2+G2–C), and the electrical signal output therefrom to the circuit chip 60 accordingly represents the pressure difference Y.

Figure 5:
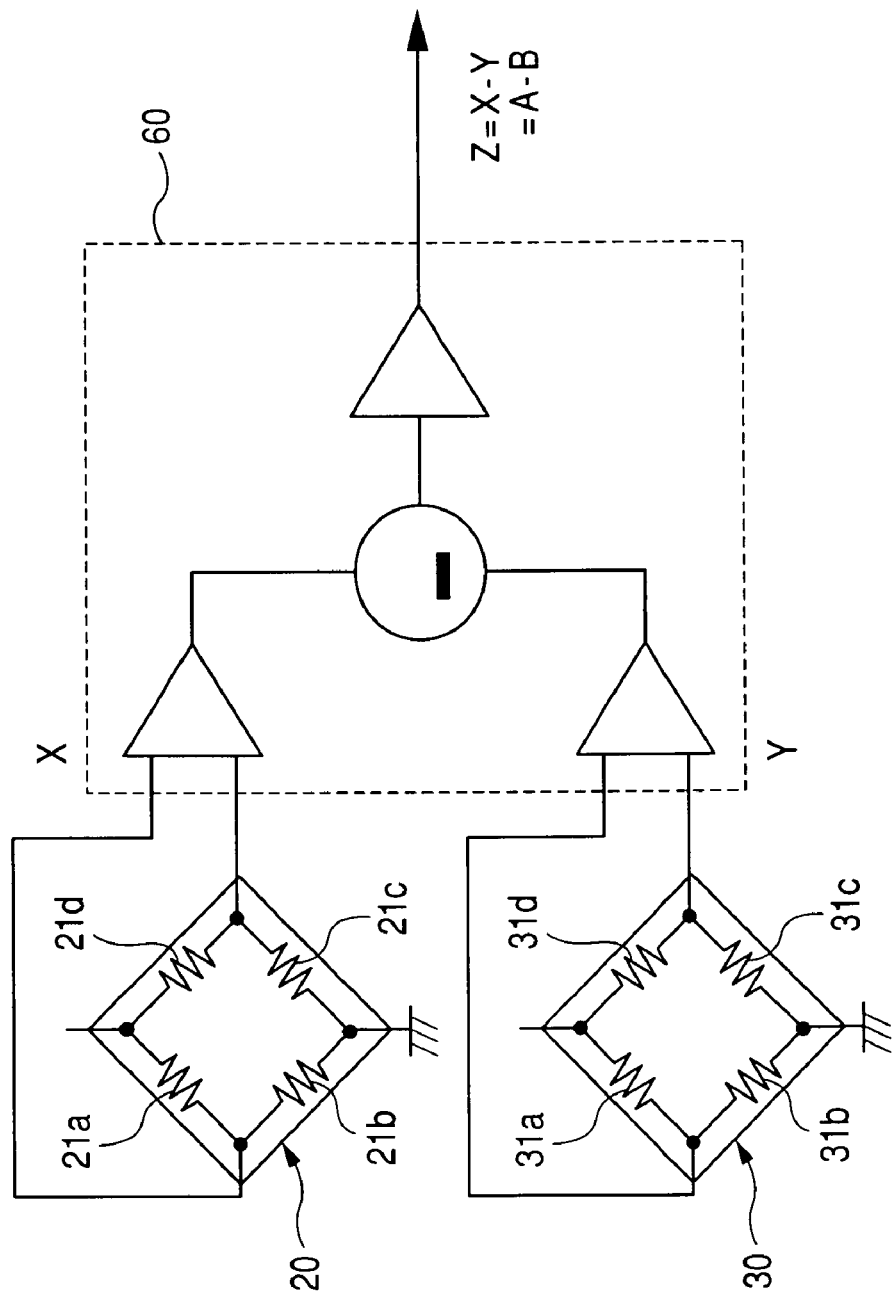
FIG. 5 is a schematic equivalent circuit of the differential pressure sensor.

Then, referring to FIG. 5, the circuit chip 60 determines, based on the electrical signals received from the first and second sensor chips 20 and 30, the differential pressure Z and outputs the electrical signal representative of the determined differential pressure Z to the engine ECU.

The differential pressure Z is equal to (X–Y), i.e., ((A+H1+G1–C)–(B+H2+G2–C)). However, due to the identical formations and symmetric arrangements of the components of the differential pressure sensor S1 as described above, the heat stresses H1 and H2 will be canceled by each other, and the heat stresses G1 and G2 will be canceled by each other. Consequently, the differential pressure Z will be eventually equal to (A–B).

The differential pressure sensor S1 according to the present embodiment has the following advantages.

In the differential pressure sensor S1, as described above, the first and second pressure introduction openings 40 and 50 formed in the body 11 of the case 10 have the same shape and size and are symmetrically positioned with respect to the separation wall 14 of the case 10. Further, the first and second sensor chips 20 and 30 have the same shape and size and are symmetrically arranged with respect to the separation wall 14. Furthermore, the first and second pressure transmission mediums 71 and 72 have the same shape and size and are symmetrically arranged with respect to the separation wall 14. In addition, the first and second seats 22 and 32 also have the same shape and size and are symmetrically arranged with respect to the separation wall 14.

Accordingly, the relation in position between the first sensor chip 20 and the first pressure introduction opening 40 is the same as that between the second sensor chip 30 and the second pressure introduction opening 50.

Consequently, during operation of the differential pressure sensor S1, the heat stresses H1 and G1 transmitted to the first sensor chip 20 via the first pressure transmission medium 71 and the seat 22 will be respectively equal to the heat stresses H2 and G2 transmitted to the second sensor chip 30 via the second transmission medium 72 and the seat 32. As a result, the differential pressure Z determined by the circuit chip 60 will be equal to (A–B).

Accordingly, the differential pressure sensor S1 can accurately determine the pressure difference (A–B) regardless of the temperatures of the exhaust gases introduced thereto from the upstream and downstream sides of the DPF.

Further, in the differential pressure sensor S1, the semiconductor circuit chip 60 is symmetrical arranged in the case 10 with respect to the separation wall 14. The additive 15 is symmetrically distributed in the case 10 with respect to the separation wall 14. These symmetrical arrangement and distribution further enhance the accuracy of the differential pressure sensor S1.

Furthermore, in the differential pressure sensor S1, the first and second pressure introduction openings 40 and 50 are configured to have the circular cross-section portions 41 and 51, respectively.

With this configuration, in manufacturing the differential pressure sensor S1, the first and second sensor chips 20 and 30 can be easily arranged in the case 10 in symmetry with respect to the separation wall 14 by aligning the axes thereof respectively with the axes of the circular cross-section portions 41 and 51.

Second Embodiment

Figure 6:
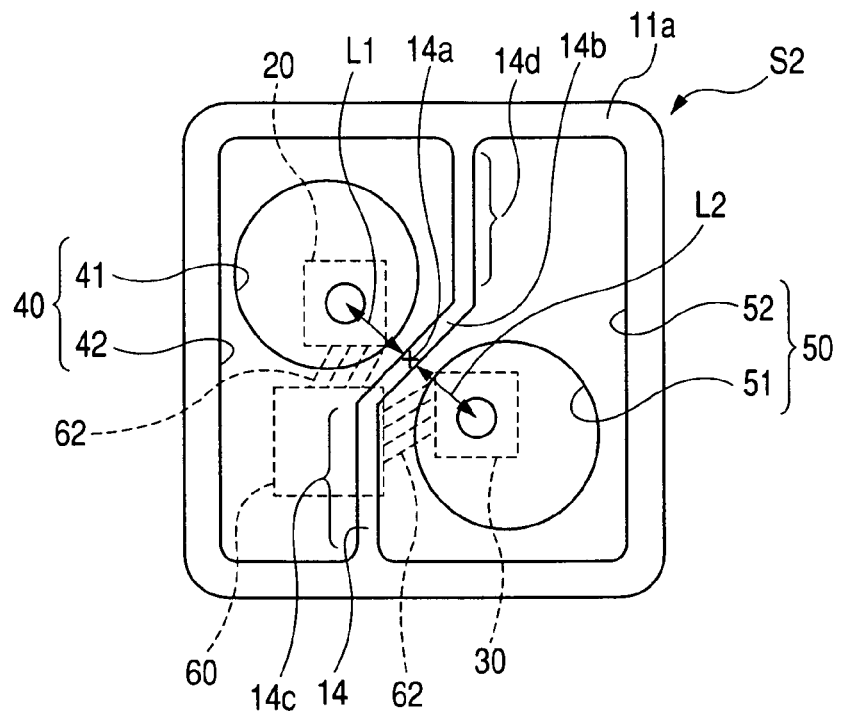
FIG. 6 is a schematic plan view of a differential pressure sensor according to the second embodiment of the invention, wherein a cover portion of a case of the differential pressure sensor is omitted.

FIG. 6 shows a differential pressure sensor S2 according to the second embodiment of the invention.

In the differential pressure sensor S2, the first and second sensor chips 20 and 30 have the shape and size and the first and second pressure introduction openings 40 and 50 have the same shape and size, as in the differential pressure sensor S1 according to the first embodiment.

However, unlike in the differential pressure sensor S1, the separation wall 14 of the case 10 is not flat in the differential pressure sensor S2. More specifically, in the present embodiment, the separation wall 14 includes, as shown in FIG. 6, a central portion 14b and a pair of side portions 14c and 14d on opposite sides of the central portion 14b. The side portions 14c and 14d have the same shape and size, and are parallel to each other. The central portion 14b connects the side portions 14c and 14d, but is not parallel to them. Therefore, when viewed along a hypothetical center line 14a of the case 10, which extends in the thickness-direction of the case 10, the central portion 14a obliquely extends between the side portions 14c and 14d.

In the differential pressure sensor S2, the first and second sensor chips 20 and 30 are so arranged in the case 10 that when viewed along the center line 14a of the case 10, the sensor chips 20 and 30 are in point symmetry with respect to the center line 14a. Accordingly, the distance L1 from the axis of the first sensor chip 20 to the center line 14a is equal to the distance L2 from the axis of the second sensor chip 30 to the center line 14a.

Further, the first and second pressure introduction openings 40 and 50 are so positioned that when viewed along the center line 14a, the openings 40 and 50 are in point symmetry with respect to the center line 14a. However, in the present embodiment, the axis of the first sensor chip 20 does not coincide with the axis of the circular cross-section portion 41 of the first pressure introduction opening 40; the axis of the second sensor chip 30 does not coincide with the axis of the circular cross-section portion 51 of the second pressure introduction opening 50.

With the above symmetric arrangements, in the differential pressure sensor S2, the relation in position between the first sensor chip 20 and the first pressure introduction opening 40 is the same as that between the second sensor chip 30 and the second pressure introduction opening 50.

Accordingly, as the differential pressure sensor S1, the differential pressure sensor S2 can also accurately determine the pressure difference (A–B) regardless of the temperatures of the exhaust gases introduced thereto from the upstream and downstream sides of the DPF.

In addition, in the differential pressure sensor S2, the circular cross-section portions 41 and 51 of the first and second pressure introduction openings 40 and 50 are not necessarily aligned in the longitudinal direction of the body portion 11 of the case 10, thereby allowing the body portion 11 to have a smaller length than in the differential pressure sensor S1.

Third Embodiment

Figure 7:
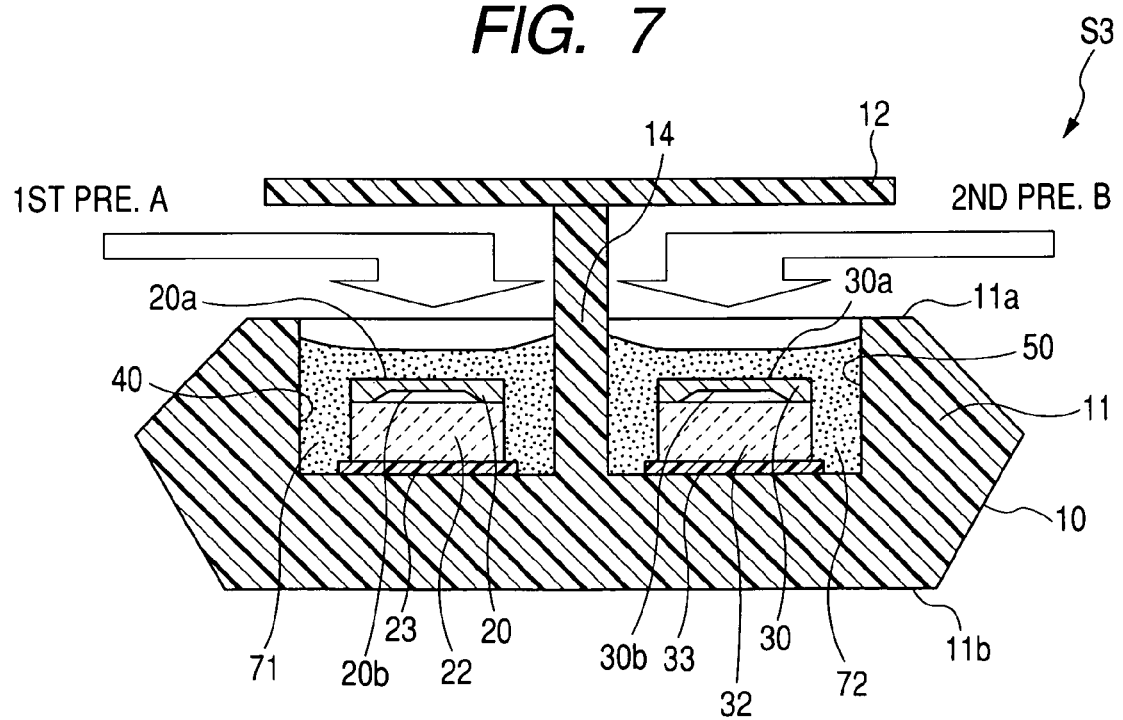
FIG. 7 is a cross-sectional side view of a differential pressure sensor according to the third embodiment of the invention.

FIG. 7 shows a differential pressure sensor S3 according to the third embodiment of the invention, which has a structure similar to that of the differential pressure sensor S1 according to the first embodiment. Accordingly, only differences between the differential pressure sensors S1 and S3 will be described hereinafter.

In the differential pressure sensor S1, as described previously, the first and second sensor chips 20 and 30 are respectively configured to sense the pressure differences (A–C) and (B–C). In other words, the first and second sensor chips 20 and 30 work as differential pressure sensing elements.

In comparison, in the differential pressure sensor S3, the first and second sensor chips 20 and 30 are respectively configured to directly sense the first and second pressures A and B. In other words, the first and second sensor chips 20 and 30 work as absolute pressure sensing elements.

More specifically, as shown in FIG. 7, in the differential pressure sensor S3, the body portion 11 of the case 10 has the first and second pressure introduction openings 40 and 50 formed on the upper face 11a thereof, but has no recess formed on the lower face 11b. Further, each of the first and second pressure introduction openings 40 and 50 does not penetrate the body portion 11 of the case 10 in the thickness-wise direction of the body portion 11, thus having the shape of a recess. In addition, though not graphically shown, each of the first and second pressure introduction openings 40 and 50 has a rectangular cross-section perpendicular to the thickness-wise direction of the body portion 11.

The first and second sensor chips 20 and 30 are mounted on the bottom faces of the first and second pressure introduction openings 40 and 50 via the seats 22 and 32 and the adhesives 23 and 33, respectively. The flat faces 20a and 30a of the sensor chips 20 and 30 are respectively covered with the first and second pressure transmission mediums 71 and 72, while the recessed faces 20b and 30b of the same form vacuums together with the upper faces of the seats 22 and 32, respectively. Further, the first and second pressure transmission mediums 71 and 72 are filled in the first and second pressure introduction openings 40 and 50 to transmit the first and second pressures A and B to the first and second sensor chips 20 and 30, respectively. Thus, with this configuration, the first and second sensor chips 20 and 30 can directly sense the first and second pressures A and B and output electrical signals representative of the sensed pressures A and B, respectively.

In addition, though not shown in FIG. 7, the differential pressure sensor S3 also includes the semiconductor circuit chip 60 which determines the pressure difference (A–B) based on the electrical signals output from the first and second sensor chips 20 and 30 and output an electrical signal representative of the pressure difference (A–B) to the engine ECU.

Furthermore, in the differential pressure sensor S3, the first and second sensor chips 20 and 30 have the same shape and size and are symmetrically arranged in the case 10 with respect to the separation wall 14 of the case 10; the first and second pressure introduction openings 40 and 50 also have the same shape and size and are symmetrically positioned in the case 10 with respect to the separation wall 14.

Accordingly, as the differential pressure sensor S1, the differential pressure sensor S3 can also accurately determine the pressure difference (A–B) regardless of the temperatures of the exhaust gases introduced thereto from the upstream and downstream sides of the DPF.

Fourth Embodiment

FIG. 8 shows a differential pressure sensor S4 according to the fourth embodiment of the invention, which has a structure similar to that of the differential pressure sensor S1 according to the first embodiment. Accordingly, only differences between the differential pressure sensors S1 and S4 will be described hereinafter.

In the differential pressure sensor S1, as described previously, the first and second sensor chips 20 and 30 are respectively configured to sense the pressure differences (A–C) and (B–C).

In comparison, in the differential pressure sensor S4, the first sensor chip 20 is configured to sense the pressure difference (A–B), while the second sensor chip 30 is configured to sense the difference between a first and a second value of the reference pressure C.

More specifically, as shown in FIG. 8, in the differential pressure sensor S4, both the first and second pressure introduction openings 40 and 50 are formed to penetrate the body portion 11 of the case 10 in the thickness-wise direction of the body portion 11.

The first pressure introduction opening 40 includes an upper portion 43, a central portion 44, and a lower portion 45, which are sequentially positioned in the thickness-wise direction of the body portion 11 from the upper face 11a to the lower face 11b of the body portion 11. The upper and lower portions 43 and 45 each have a rectangular cross-section perpendicular to the thickness-wise direction of the body portion 11, while the central portion 44 has a circular cross-section perpendicular to the thickness-wise direction. The diameter of the central portion 44 is less than both the length and width of the other portions 43 and 45. Similarly, the second pressure introduction opening 50 includes an upper portion 53, a central portion 54, and a lower portion 55, which are sequentially positioned in the thickness-wise direction of the body portion 11 from the upper face 11a to the lower face 11b. The upper and lower portions 53 and 55 each have a rectangular cross-section perpendicular to the thickness-wise direction of the body portion 11, while the central portion 54 has a circular cross-section perpendicular to the thickness-wise direction. The diameter of the central portion 54 is less than both the length and width of the other portions 53 and 55.

The first and second sensor chips 20 and 30 are mounted on shoulders 46 and 56 formed between the upper and central portions 43 and 44 of the opening 40 and between the upper and central portions 53 and 54 of the opening 50 via the seats 22 and 32 and the adhesives 23 and 33, respectively, thereby partitioning the insides of the openings 40 and 50 into upper and lower parts.

Further, the upper and lower parts of the inside of the first pressure introduction opening 40 are respectively filled with the pressure transmission mediums 71a and 71b. Similarly, the upper and lower parts of the inside of the second pressure introduction opening 50 are respectively filled with the pressure transmission mediums 72a and 72b. In addition, in the present embodiment, all the pressure transmission mediums 71a, 71b, 72a, and 72b are made of the same gel-like material.

With the above configuration, in practical use, the first sensor chip 20 receives, on the flat face 20a thereof, the first pressure A transmitted thereto via the pressure transmission medium 71a, a heat stress H1' transmitted thereto via the seat 22, and a heat stress G1' transmitted thereto via the pressure transmission medium 71a; it also receives, on the recessed face 20b thereof, the second pressure B transmitted thereto via the pressure transmission medium 71b. Consequently, the first sensor chip 20 actually senses a pressure difference X', which is equal to (A–B+H1'+G1'), and outputs an electrical signal representative of the pressure difference X'. On the other hand, the second sensor chip 30 receives, on the flat face 30a thereof, the reference pressure C transmitted thereto via the pressure transmission medium 72a, a heat stress H2' transmitted thereto via the seat 32, and a heat stress G2' transmitted thereto via the pressure transmission medium 72a; it also receives, on the recessed face 30b thereof, the reference pressure C transmitted thereto via the pressure transmission medium 72b. Consequently, the second sensor chip 30 actually senses a pressure difference Y', which is equal to (H2'+G2'), and outputs an electrical signal representative of the pressure difference Y'.

Further, though not shown in FIG. 8, the differential pressure sensor S4 also includes the semiconductor circuit chip 60 which determines, based on the electrical signals output from the first and second sensor chips 20 and 30, a differential pressure Z' and outputs an electrical signal representative of the differential pressure Z' to the engine ECU. The differential pressure Z' is equal to (X'–Y'), i.e., (A–B+H1'+G1'–H2'–G2').

Furthermore, in the differential pressure sensor S4, the first and second sensor chips 20 and 30 have the same shape and size and are symmetrically arranged in the case 10 with respect to the separation wall 14 of the case 10; the first and second pressure introduction openings 40 and 50 also have the same shape and size and are symmetrically positioned in the case 10 with respect to the separation wall 14. In addition, the pressure transmission mediums 71a and 72a have the same shape and size and are symmetrically arranged in the case 10 with respect to the separation wall 14.

With the above identical formations and symmetric arrangements of the components of the differential pressure sensor S4, the heat stresses H1' and H2' will be canceled by each other, and the heat stresses G1' and G2' will be canceled by each other. Consequently, the differential pressure Z' will be eventually equal to (A–B).

Accordingly, as the differential pressure sensor S1, the differential pressure sensor S4 can also accurately determine the pressure difference (A–B) regardless of the temperatures of the exhaust gases introduced thereto from the upstream and downstream sides of the DPF.

Fifth Embodiment

FIG. 9 shows a differential pressure sensor S5 according to the fifth embodiment of the invention, which has a structure similar to that of the differential pressure sensor S1 according to the first embodiment. Accordingly, only differences between the differential pressure sensors S1 and S5 will be described hereinafter.

In the differential pressure sensor S1, the entire separation wall 14 is made of the same resin as the body portion 11 of the case 10.

In comparison, in the differential pressure sensor S5, the separation wall 14 is made of a resin and a metal.

More specifically, as shown in FIG. 9, in the differential pressure sensor S5, the separation wall 14 is made in two-part form. The first part 14e is made of a highly heat-conductive metal and separates the rectangular cross-section portions 42 and 52 of the first and second pressure introduction openings 40 and 50; the second part 14f is made of the same resin as the body portion 11 of the case 10 and separates the circular cross-section portions 41 and 51 of the openings 40 and 50.

In practical use, there may be a temperature difference between the insides of the first and second pressure introduction openings 40 and 50, depending on the difference in temperature between the exhaust gases on the upstream and downstream sides of the DPF and the difference between heats radiated from the exhaust pipe to the first and second pressure introduction openings 40 and 50.

Such a temperature difference will cause a pressure difference between the insides of the first and second pressure introduction openings 40 and 50, even when the actual difference between the first and second pressures A and B is zero. The pressure difference may be mistaken for the difference between the first and second pressures A and B, thus resulting in a sensing error.

However, in the differential pressure sensor S5, since the first part 14e of the separation wall 14 is highly heat-conductive, it is easy for heat to be transferred between the first and second pressure introduction openings 40 and 50. Consequently, the temperature difference between the insides of the first and second pressure introduction openings 40 and 50 can be minimized, thus minimizing the sensing error caused by the temperature difference.

Sixth Embodiment

Figure 10:
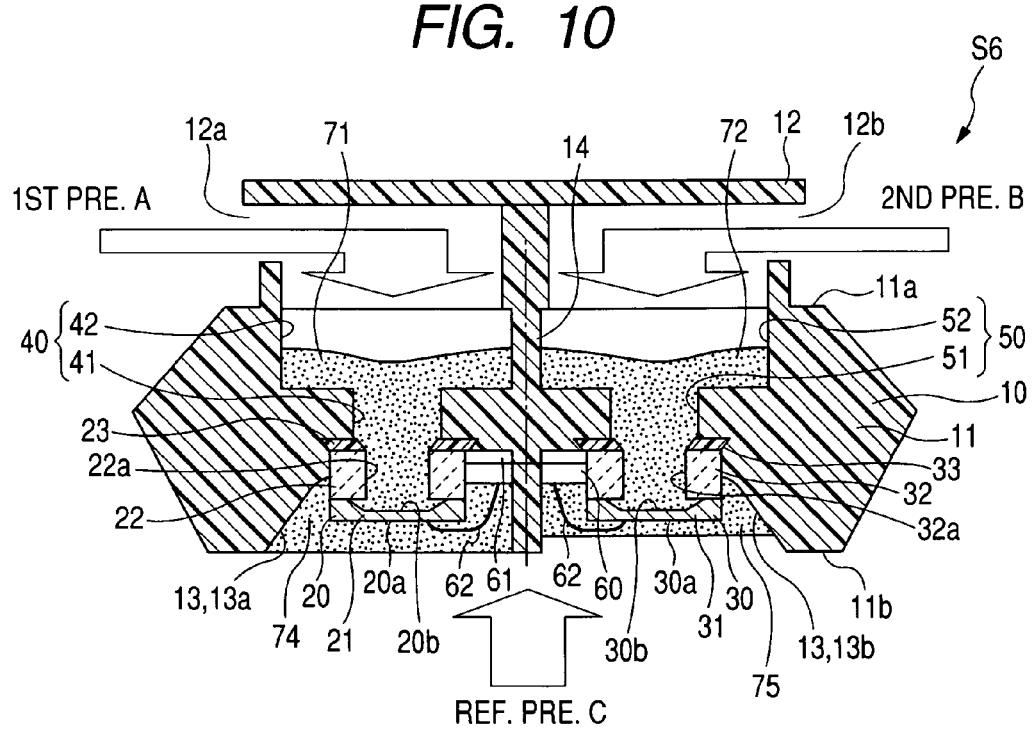
FIG. 10 is a cross-sectional side view of a differential pressure sensor according to the sixth embodiment of the invention.
Figure 11:
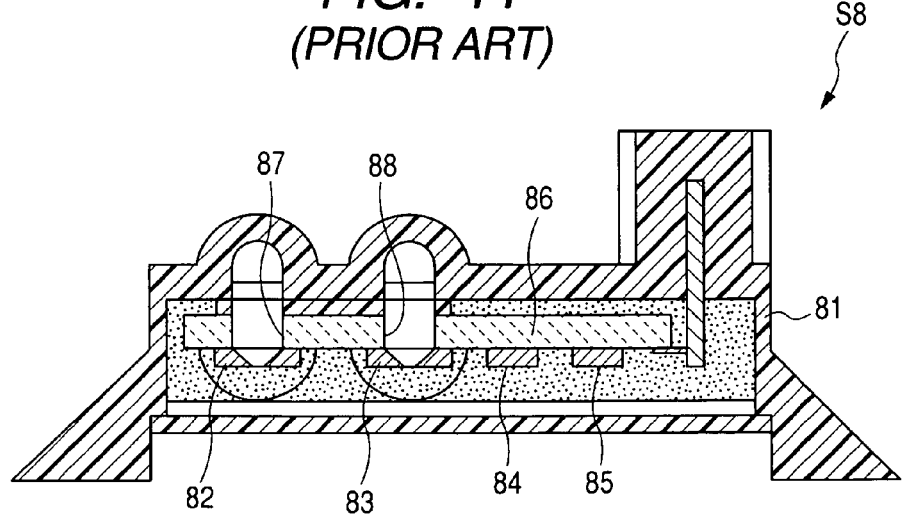
FIG. 11 is a cross-sectional side view of a prior art differential pressure sensor.
Figure 12:
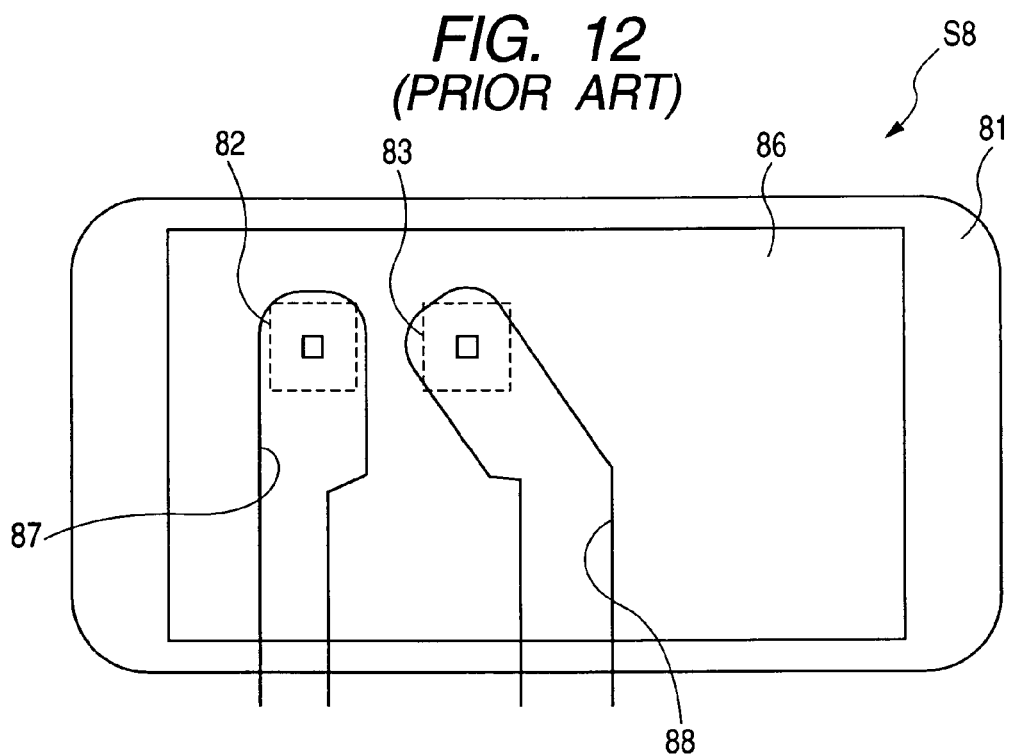
FIG. 12 is a top end view of the prior art differential pressure sensor.
Figure 13:
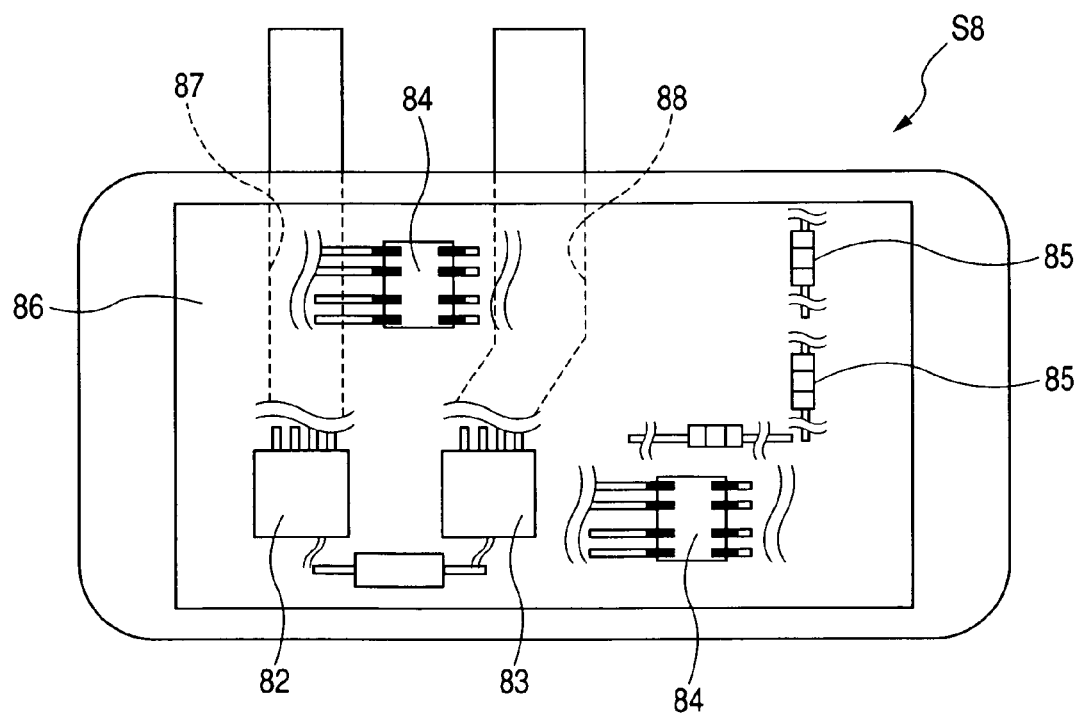
FIG. 13 is a bottom end view of the prior art differential pressure sensor.

FIG. 10 shows a differential pressure sensor S6 according to the sixth embodiment of the invention, which has a structure similar to that of the differential pressure sensor S1 according to the first embodiment. Accordingly, only differences between the differential pressure sensors S1 and S6 will be described hereinafter.

Unlike in the differential pressure sensor S1, the separation wall 14 in the differential pressure sensor S6 extends, as shown in FIG. 10, to further separate the recess 13 formed on the lower face 11b of the body portion 11 of the case 10 into two parts, i.e., a first part 13a on the first sensor chip 20-side and a second part 13b on the second sensor chip 30-side. The first and second parts 13a and 13b respectively make up a third and a fourth pressure introduction opening of the differential pressure sensor S6.

The third pressure introduction opening 13a is filled with a third pressure transmission medium 74; the fourth pressure introduction opening 13b is filled with a fourth pressure transmission medium 75. The third and fourth pressure transmission mediums 74 and 75 are made of the same gel-like material as the third pressure transmission medium 73 in the differential pressure sensor S1. The third and fourth pressure transmission mediums 74 and 75 serve to transmit the reference pressure C to the flat faces 20a and 30a of the first and second sensor chips 20 and 30, respectively.

Further, in practical use, the temperature of the exhaust gas introduced from the upstream side of the DPF via the first port 12a into the first pressure introduction opening 40 is usually higher than that introduced from the downstream side of the DPF via the second port 12b into the second pressure introduction opening 50. Considering the above fact, in the differential pressure sensor S6, the third pressure transmission medium 74 is formed with a larger amount of the gel-like material than the fourth pressure transmission medium 75, so as to dissipate more heat for the first pressure introduction opening 40 than for the second pressure introduction opening 50.

More specifically, in the differential pressure sensor S6, the third and fourth pressure transmission mediums 74 and 75 also serve as heat sinks to respectively absorb heat from the first and second pressure introduction openings 40 and 50. Thus, with the larger amount of the material, the third pressure transmission medium 74 can absorb more heat than the fourth pressure transmission medium 75, thereby minimizing the temperature difference between the insides of the first and second pressure introduction openings 40 and 50. Consequently, the sensing error of the differential pressure sensor S6 caused by the temperature difference can accordingly be minimized.

Moreover, in the differential pressure sensor S6, the third and fourth pressure transmission mediums 74 and 75 transmit the reference pressure C rather than the first and second pressures A and B; the third and fourth pressure introduction openings 13a and 13b are made much wider than the circular cross-section portions 41 and 42 of the first and second pressure introduction openings 40 and 50. Accordingly, though the third and fourth pressure transmission mediums 74 and 75 are formed with different amounts of the material, it is still possible to secure high accuracy of the differential pressure sensor S6.

In addition, it is also possible to fill only the third pressure introduction opening 13a with the third pressure transmission medium 73, without filling the fourth pressure introduction opening 13b with any pressure transmission medium.

Other Embodiments

While the above particular embodiments of the invention have been shown and described, it will be understood by those who practice the invention and those skilled in the art that various modifications, changes, and improvements may be made to the invention without departing from the spirit of the disclosed concept.

(1) Though the first and second pressure introduction openings 40 and 50 are formed to occupy most central area of the upper face 11a of the body portion 11 of the case 10 in the first embodiment, they can also be formed to occupy any area of any size on the upper face 11a provided that they have the same shape and size and are symmetrically positioned with respect to the separation wall 14.

(2) Though the first and second pressure introduction openings 40 and 50 are separated by the single separation wall 14 in the first embodiment, they can also be separated more than one separation wall.

(3) Though the first and second pressure transmission mediums 71 and 72 are made of a gel-like material in the first embodiment, they can also be made of other solid or liquid materials, such as oil. Further, it is also possible to omit the pressure transmission mediums 71 and 72 from the differential pressure sensor configuration.

(4) Though there is provided only the semiconductor circuit chip 60 in the case 10 besides the first and second sensor chips 20 and 30 in the first embodiment, it is also possible to provide more chips or devices in the case 10 provided that they are symmetrically positioned with respect to the separation wall 14.

(5) Though the circuit chip 60 is provided in the case 10 in the first embodiment, it can also be provided outside the case 10.

(6) Though the differential pressure sensor S1 is illustrated as for detecting the pressure loss caused by the DPF in the first embodiment, it can also be applied to any other differential pressure detection.

(7) Though the first and second sensor chips 20 and 30 are employed as pressure sensing elements in the first embodiment, it is also possible to alternatively employ any other types of pressure sensing elements.

Such modifications, changes, and improvements within the skill of the art are intended to be covered by the appended claims.

What is claimed is:

1. A differential pressure sensor comprising:
    a case;
    a first and a second pressure sensing element received in the case, the first pressure sensing element working to sense a first pressure and output a first electrical signal representative of the sensed first pressure, the second pressure sensing element working to sense a second pressure and output a second electrical signal representative of the sensed second pressure;
    a first and a second pressure introduction passage which are provided in the case to introduce the first and second pressures to the first and second pressure sensing elements, respectively; and
    a differential pressure determining element working to determine a differential pressure, which is the difference between the first and second pressures, based on the first and second electric signals output from the first and second pressure sensing elements, the differential pressure determining element also working to output an electrical signal representative of the determined differential pressure, wherein
    the first and second pressure sensing elements have the same shape and size and are symmetrically arranged in the case with respect to a reference,
    the first and second pressure introduction passages also have the same shape and size and are symmetrically positioned in the case with respect to the reference, the differential pressure sensor further comprises a third and a fourth pressure introduction passages which are provided in the case to introduce a reference pressure respectively to the first and second pressure sensing elements,
    the case has a first and a second end face that are opposite to each other,
    the first and second pressure introduction passages are formed through the first end face of the case, and the third and fourth pressure introduction passages are formed through the second end face of the case,
    the first pressure sensing element is configured to sense the first pressure as a first relative pressure to the reference pressure, and the second pressure sensing element is configured to sense the second pressure as a second relative pressure to the reference pressure, and
    the differential pressure determining element is configured to determine the differential pressure as the difference between the first and second relative pressures.

2. The differential pressure sensor as set forth in Claim 1, further comprising a third and a fourth pressure transmission medium which are filled in the third and fourth pressure introduction passages to transmit the reference pressure to the first and second pressure sensing elements and absorb heat from the first and second pressure introduction passages, respectively,
    wherein the third pressure transmission medium is formed with a larger amount of a gel-like material than the fourth pressure transmission medium.

3. The differential pressure sensor as set forth in Claim 1, further comprising a pressure transmission medium which is filled only in the third one of the third and fourth pressure introduction passages to transmit the reference pressure to the first pressure sensing element and absorb heat from the first pressure introduction passage.

* * * * *